United States Patent [19]
Akiyama

[11] Patent Number: 5,089,435
[45] Date of Patent: Feb. 18, 1992

[54] METHOD OF MAKING A FIELD EFFECT TRANSISTOR WITH SHORT CHANNEL LENGTH

[75] Inventor: Hiroaki Akiyama, Tokyo, Japan
[73] Assignee: NEC Corporation, Tokyo, Japan
[21] Appl. No.: 607,342
[22] Filed: Oct. 31, 1990

Related U.S. Application Data

[60] Division of Ser. No. 456,195, Dec. 19, 1989, abandoned, which is a continuation-in-part of Ser. No. 199,653, May 27, 1988, abandoned.

[30] Foreign Application Priority Data

May 27, 1987 [JP] Japan ............................ 62-130742

[51] Int. Cl.⁵ .................. H01L 21/265; H01L 21/225
[52] U.S. Cl. ................................... 437/44; 437/162; 437/913
[58] Field of Search ............... 437/44, 913, 162; 357/23.9

[56] References Cited

FOREIGN PATENT DOCUMENTS 196573 12/1982 Japan .................................. 437/162
147774 7/1987 Japan .
02825 5/1987 World Int. Prop. O. ............ 437/44

Primary Examiner—Brian E. Hearn
Assistant Examiner—Linda J. Fleck
Attorney, Agent, or Firm—Sughrue, Mion, Zinn, Macpeak & Seas

[57] ABSTRACT

For preventing a field effect transistor from driftage of the threshold voltage due to injection of hot carriers, there is disclosed a field effect transistor fabricated on a semiconductor substrate and comprising a thin dielectric film with two openings covering the major surface and having a portion serving as a gate insulating film, a gate electrode formed on the portion of the thin dielectric film and covered with an isolation film, first and second lightly doped impurity regions formed in the semiconductor substrate in spacing relationship from each other and having respective edge portions located below the two side portions of the gate electrode, respectively, side walls projecting from the isolation film covering the two side portions, respectively, and directly contacting the major surface through the two openings, respectively, and first and second heavily doped impurity regions formed in the semiconductor substrate partially overlapped with the first and second lightly doped impurity regions, respectively, and the first and second heavily doped impurity regions have respective edge portions located below the leading ends of the side walls, respectively, to form an LDD-structure, so that the injected hot carriers are discharged to the lightly doped impurity regions by virtue of the direct contacts between the side walls and the lightly doped impurity regions.

1 Claim, 3 Drawing Sheets

PRIOR-ART

METHOD OF MAKING A FIELD EFFECT TRANSISTOR WITH SHORT CHANNEL LENGTH

This is a Divisional of Application Ser. No. 07/456,195 filed Dec. 19, 1989 now abandoned, which was a Continuation of application Ser. No. 07/199,653 filed May 27, 1988 now abandoned.

FIELD OF THE INVENTION

This invention relates to a field effect transistor and, more particularly, to the structure of side walls provided beside a gate electrode of the field effect transistor having a relatively short channel length.

BACKGROUND OF THE INVENTION

In order to increase the number of component MOS-type field effect transistors, the device dimensions must be scaled down, so that many undesirable effects tend to take place in each component MOS-type field effect transistor due to short channel. One of the undesirable effects is known as the injection of hot electrons produced by an extremely large electric field around the drain region. This results in driftage of the threshold voltage. One of approaches to overcome the problem in driftage of the threshold voltage is to provide source/drain regions each formed by two impurity regions different in impurity concentration from each other. The MOS-type field effect transistor thus arranged is capable of reduction of the injection of hot carriers by virtue of the lightly-doped impurity region forming part of each source /drain region. The structure of the MOS-type field effect transistor is called as an LDD-structure.

In FIG. 1 of the drawings, there is shown a typical example of the MOS-type field effect transistor of the type having the source/drain regions each formed by the combination of the two different impurity regions. The MOS-type field effect transistor shown in FIG. 1 is fabricated on a p-type silicon substrate 1 on which a gate insulating film 2 and a gate structure is formed by using usual techniques. The gate structure comprises an gate electrode 3 covered with a thin dielectric film 4 and side walls 5 and 6 provided on both sides of the gate electrode 3. In the p-type silicon substrate 1 are formed source/drain regions each consisting of a lightly doped portion 7 or 8 and a heavily doped portion 9 or 10. The source/drain regions are covered with a thin silicon oxide film 11, so that the side walls 5 and 6 are provided on the thin silicon oxide film 11.

In the fabrication process of the MOS-type field effect transistor, the gate electrode 3 is formed by using lithographic techniques, and phosphorus atoms are lightly implanted into the p-type silicon substrate 1 in a self-aligned manner using the gate electrode 3 as a ask. After formation of the lightly doped portions 7 and 8, polysilicon or silicon dioxide is deposited entire surface of the structure by using a chemical vapor deposition technique to form a polysilicon film or a silicon dioxide film covering the entire surface of the structure. The polysilicon film or the silicon dioxide film is anisotropically etched away until the thin insulating film is exposed, so that the side walls 5 and 6 remain on the thin dielectric film 4 covering both sides of the gate electrode 3. When the side walls 5 and 6 are formed, arsenic atoms are heavily implanted into the p-type silicon substrate using the side walls 5 and 6 as a mask.

The MOS-type field effect transistor thus formed has the lightly doped portions 7 and 8 contiguous to a channel forming area below the gate electrode 3, so that electric fields induced around the source/drain regions are decreased in intensity, thereby reducing the injection of the hot electrons. However, a problem is still encountered in the MOS-type field effect transistor shown in FIG. 1 in driftage of the transistor's characteristics such as, for example, the threshold voltage and the channel conductance. This is because of the fact that the hot electrons are trapped in the dielectric film underneath the side walls 5 and 6 during operation thereof.

SUMMARY OF THE INVENTION

It is therefore an important object of the present invention to provide the structure of a field effect transistor which is stable in characteristics for a prolonged period of time.

It is another important object of the present invention to provide the structure of a field effect transistor which can eliminate the driftage of the threshold voltage due to injection of the hot carriers.

It is also important object of the present invention to provide the structure of a field effect transistor which produces a channel with a stable conductance.

To accomplish these objects, the present invention proposes to remove the dielectric film between the side walls and the silicon substrate so as to allow the side walls to be in direct contact with the lightly doped portions formed in the silicon substrate.

In accordance with the present invention, there is provided a field effect transistor fabricated on a semiconductor substrate of a first conductivity type having a major surface, comprising: a) a thin dielectric film covering the major surface of the semiconductor substrate and having a portion serving as a gate insulating film, the thin dielectric film being formed with two openings exposing the major surface and located outside the portion; b) a gate electrode formed on the portion of the thin dielectric film and having two side portions spaced from each other; c) an isolation film covering the gate electrode; d) first and second lightly doped impurity regions of a second conductivity type formed in the semiconductor substrate in spacing relationship from each other and having respective edge portions located below the two side portions of the gate electrode, respectively; e) side walls projecting from the isolation film covering the two side portions, respectively, and having respective leading ends, the side walls being in contact with the major surface through the two openings formed in the thin dielectric film, respectively; and f) first and second heavily doped impurity regions of the second conductivity type formed in the semiconductor substrate partially overlapped with the first and second lightly doped impurity regions, respectively, the first and second heavily doped impurity regions having respective edge portions located below the leading ends, respectively.

The isolation film may have a thickness ranging between about 200 angstroms and about 600 angstroms, this thickness is important to provide a sufficient withstand voltage and to define the length of the lightly doped impurity regions for the LDD-structure.

BRIEF DESCRIPTION OF THE DRAWINGS

The features and advantages of a field effect transistor according to the present invention will be more clearly understood from the following description taken in conjunction with the accompanying drawings in which.

DESCRIPTION OF THE PREFERRED EMBODIMENTS

Figure 1:
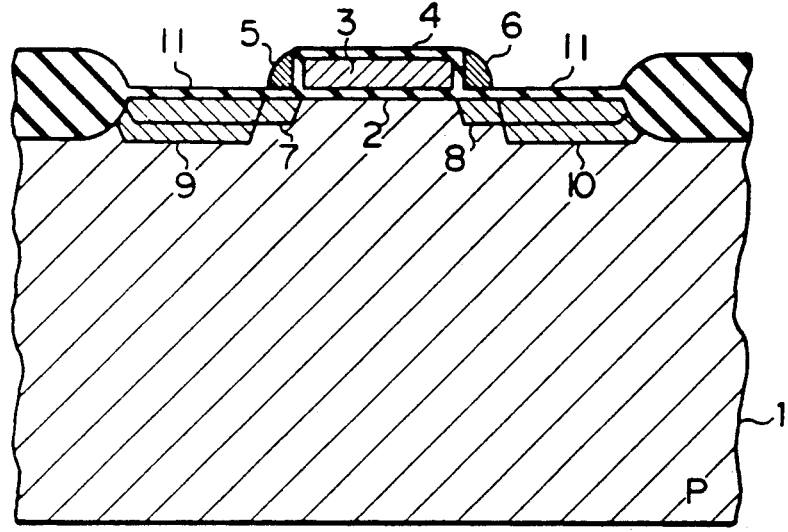
FIG. 1 is a cross sectional view showing a typical example of the field effect transistor with the LDD-structure.
Figure 2:
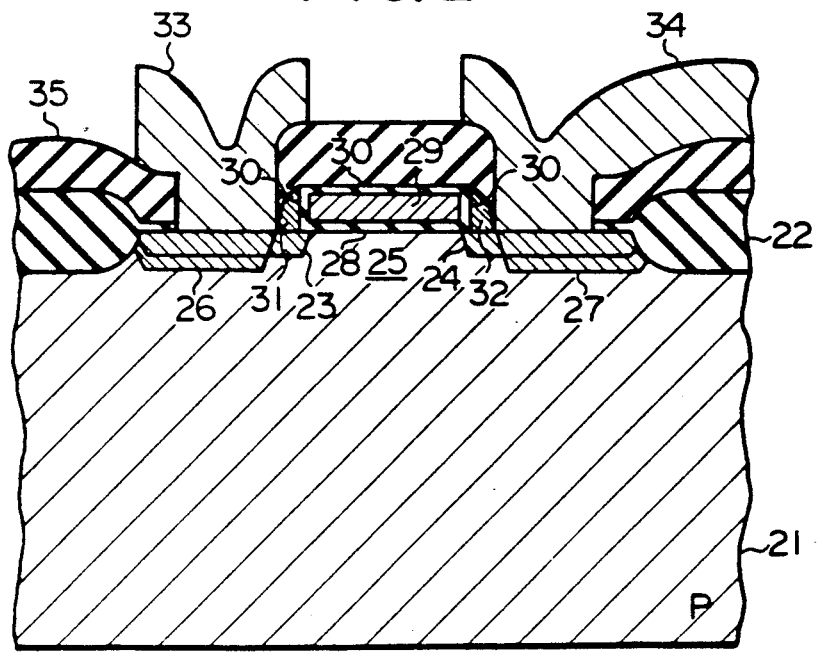
FIG. 2 is a cross sectional view showing the structure of a field effect transistor embodying the present invention.

Referring first to FIG. 2 of the drawings, there is shown the structure of a MOS-type field effect transistor embodying the present invention. The MOS-type field effect transistor is fabricated on a p-type single crystal silicon substrate 21 having an active area defined by a thick field oxide film 22. In the active area, lightly doped n-type impurity regions 23 and 24 are formed and spaced apart form each other by a channel forming region 25. The active area is further formed with heavily doped n-type impurity regions 26 and 27 partially overlapped with the lightly doped n-type impurity regions, respectively, and the lightly doped n-type impurity regions 23 and 24 and the heavily doped n-type impurity regions 26 and 27 form in combination source/drain regions, respectively. On the channel forming region 25 is formed a gate insulating film 28 of silicon dioxide which is overlain by a gate electrode 29 of a polysilicon. In this instance, the gate electrode 29 has a generally rectangular cross section and provided with two side surfaces. The gate electrode 29 is perfectly covered with an isolating film 30 of silicon dioxide, and side walls 31 and 32 are provided on the isolating film 30 covering the side surfaces of the gate electrode 29, respectively. As will be seen from FIG. 2, the dielectric film coextensive to the gate insulating film 28 is partially removed to expose the source/drain regions to not only wiring layers 33 and 34 but also the side walls 31 and 32, respectively. Then, the side walls 31 and 32 are directly in contact with the lightly doped n-type impurity regions 23 and 24, respectively. For providing perfect electrical isolation, a thick insulating film 35 intervenes between the wiring layers 33 and 34 and the isolating film 30 on the gate electrode 29.

The lightly doped n-type impurity regions forming parts of the source/drain regions have respective edges located below the side surfaces of the gate electrode 29, respectively, and the heavily doped n-type impurity regions also forming parts of the source/drain regions have respective edges located below the leading edges of the side walls 31 and 32, respectively. In this instance, the isolating film 30 covering the side surface of the gate electrode 29 has a thickness ranging between about 200 angstroms and about 600 angstroms, so that the lightly doped n-type impurity regions 23 and 24 are respectively projected from the heavily doped n-type impurity regions 26 and 27 by respective distances each having a length approximately equal to the total thicknesses of the isolating film 30 and the side wall 31 or 32. The thickness ranging between about 200 angstroms and about 600 angstroms is needed at the both side portions of the isolating film 30 for preventing the isolating film 30 between the gate electrode 29 and the side walls 31 and 32 from breakdown. Then, if the isolating film 30 is larger in thickness than about 600 angstroms, the projecting distances are too large to form the LDD-structure providing for not only reduced electric fields but also an appropriate channel conductance. On the other hand, if the isolating film 30 is less than about 200 angstroms, insufficient electrical isolation is provided for the gate electrode 29. In other words, the isolating film 30 merely has an insufficient withstand voltage.

Figure 3A:
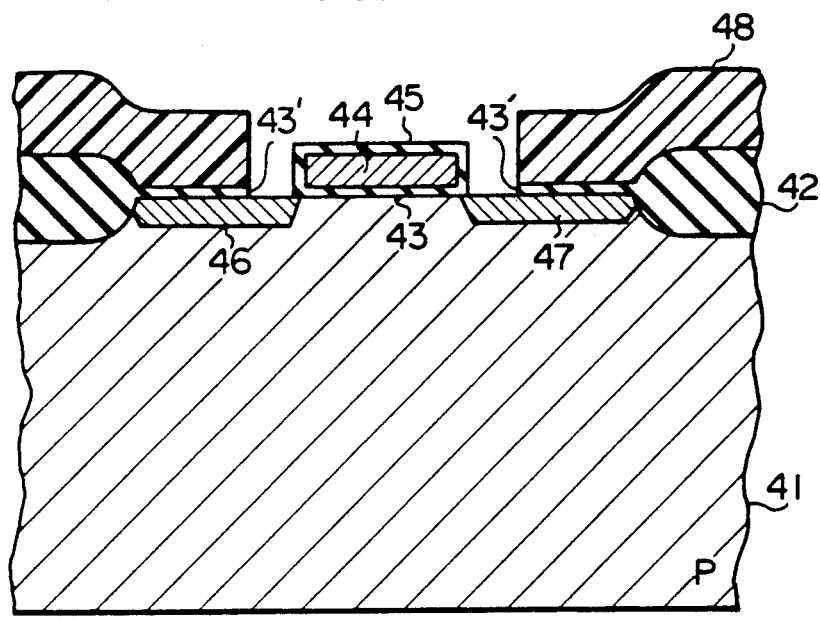
FIGS. 3A to 3C are cross sectional views showing a process sequence for fabricating the structure illustrated in FIG. 2.
Figure 3B:
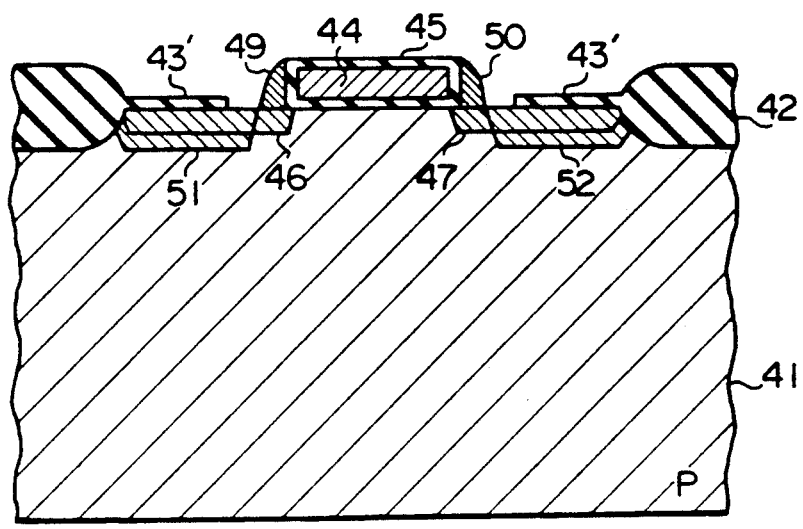
Figure 3C:
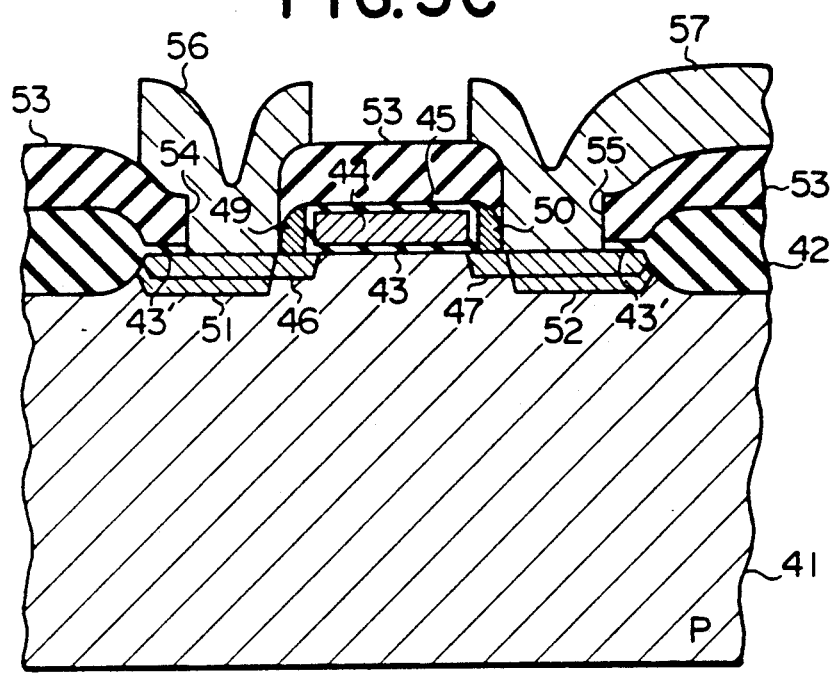

Description is made for a process sequence for fabricating the structure illustrated in FIG. 2 with reference to FIGS. 3A to 3C. The fabrication process starts with a p-type single crystal silicon substrate 41. A thick field oxide film 42 is grown on the major surface of the silicon substrate 41 by using localized oxidation of silicon techniques, then an active area is defined by the thick field oxide film 42. On the entire active area is thermally grown a thin silicon dioxide film 43 which is overlain by a conductive material such as, for example, a doped polysilicon deposited by using a chemical vapor deposition technique. The conductive material and the thin silicon dioxide film 43 are etched and patterned by using lithographic techniques for forming a gate electrode 44 and a gate insulating film, and, then, the silicon substrate 41 is placed in a high temperature oxidation ambient to form a silicon dioxide film 43' and an isolating film 45 of silicon dioxide covering the entire surface of the gate electrode 44. The silicon dioxide film 43' is smaller in thickness than the isolating film 45. After formation of the isolating film 45, phosphorus atoms at a dose of about $5 \times 10^{13}$ atoms/cm$^2$ are implanted into the silicon substrate 41 at 30 KeV to form lightly doped impurity regions 46 and 47 using the gate electrode 44 covered with the isolating film 45 as a mask. During a heat treatment for curing the silicon crystal, the implanted phosphorus atoms are slightly diffused, so that the lightly doped impurity regions 46 and 47 extend underneath the isolating film 45. A photo-resist material is applied on the entire surface of the structure, and the photo-resist material is partially removed by using lithographic techniques to form a mask layer 48 exposing a side wall forming area. Then, the thin silicon dioxide film 43' is partially etched away to expose the major surface of the silicon substrate 41 as illustrated in FIG. 3A. In this stage, an anisotropic etching technique is used to expose the major surface of the silicon substrate 41, and, for this reason, the isolating film 45 remains on the gate electrode 44. The isolating film 45 on the top surface of the gate electrode 44 is reduced in thickness during the anisotropic etching process, however another insulating film is thereafter deposited on the isolating film 45, so that no problem is encountered in the isolation.

After the mask layer 48 is stripped off, an n-type doped polysilicon is deposited on the entire surface of the structure to a thickness of about 4000 angstroms by using a chemical vapor deposition technique, and the n-type doped polysilicon is anisotropically etched away by using, for example, a reactive etching technique until the thin silicon dioxide film 43 is exposed. Then, side walls 49 and 50 are formed in such a manner as to be in contact with the lightly doped impurity regions 46 and 47. Subsequently, arsenic atoms at a dose of about $5 \times 10^{15}$ atoms/cm$^2$ are implanted into the silicon substrate 41 at 70 KeV to form heavily doped impurity regions 51 and 52 using the side walls 49 and 50 as a mask. The lightly doped impurity regions 46 and 47 and the heavily doped impurity regions 51 and 52 respectively form in combination source/drain regions of the MOS-type field effect transistor. The resultant structure is illustrated in FIG. 3B.

Subsequent step is formation of an insulating film 53. On the entire surface of the resultant structure is deposited a dielectric material such as, for example, silicon dioxide which is partially removed to form contact windows 54 and 55 exposing the heavily doped impurity regions 51 and 52 by using lithographic techniques. The contact windows 54 and 55 are thus formed, then aluminum is deposited on the entire surface of the structure and the aluminum layer is etched and patterned to form wiring layers 56 and 57. The resultant structure is illustrated in FIG. 3C.

Figure 4:
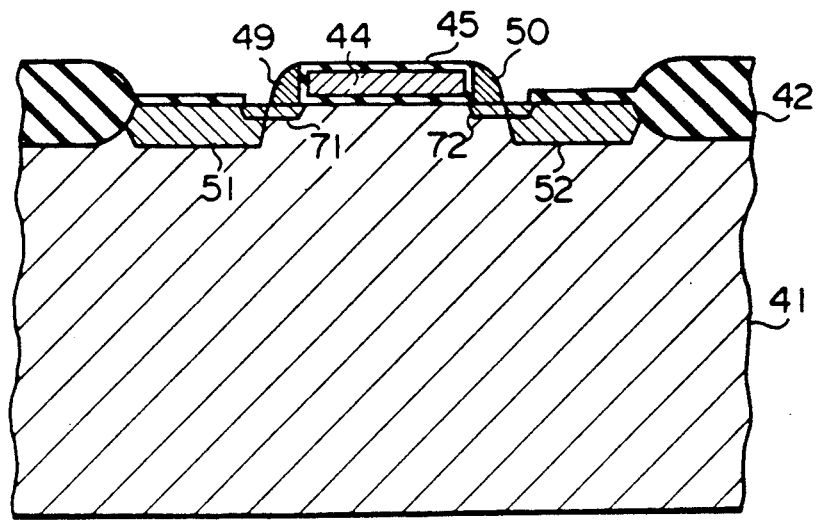
FIG. 4 is a cross sectional view showing a intermediate step used in another fabrication process for the structure illustrated in FIG. 2.

Turning to FIG. 4 of the drawings, there is shown a structure taking place during another process sequence. In this process sequence, lightly doped impurity regions 71 and 72 are formed as follows. Namely, after formation of the isolating film 45 covering the gate electrode 44, an n-type doped polysilicon is deposited on the entire surface of the structure, and the structure is placed in a high temperature ambient, so that the n-type impurity atoms are diffused into the silicon substrate 41 to form the lightly doped impurity regions 71 and 72. The lightly doped impurity regions 71 and 72 are thus formed, then the doped polysilicon is anisotropically etched to form the side walls 49 and 50. Subsequently, ion implantation is carried out to form the heavily doped impurity regions 51 and 52 using the side walls 49 and 50 as a mask as similar to the process sequence described hereinbefore.

As will be clearly understood from the foregoing description, the side walls are directly in contact with the lightly doped impurity regions, so that no hot electrons are trapped even if hot electrons are produced around the junction between the source/drain regions and the substrate. This results in stable device characteristics such as, for example, the threshold voltage and the channel conductance.

Although particular embodiments of the present invention have been shown and described, it will be obvious to those skilled in the art that various changes and modifications may be made without departing from the spirit and scope of the present invention.

What is claimed is:

1. A process of fabricating a field effect transistor on a semiconductor substrate of a first conductivity type, comprising the steps of:
   a) forming a gate insulating film overlain by a gate electrode on an area of a surface of said semiconductor substrate, other areas of said surface of said semiconductor substrate on both sides of said gate insulating film being exposed, respectively;
   b) covering the entire surface of said gate electrode and said other areas with an insulating film;
   c) removing said insulating film on said other areas for exposing said other areas for forming lightly doped source and drain regions;
   d) depositing a polysilicon film on the entire surface so as to cover said insulating film at least left on said gate electrode and said other areas of said surface of said semiconductor substrate;
   e) doping said polysilicon film with impurity atoms of a second conductivity type opposite to said first conductivity type, said impurity atoms being diffused from said polysilicon film into said other areas so that said lightly doped source and drain region are formed in said semiconductor substrate;
   f) anisotropically etching said polysilicon film so as to form side walls covering said lightly doped source and drain regions, respectively; and
   g) ion implanting impurity atoms of said second conductivity type into said semiconductor substrate for forming heavily doped source and drain region, said gate electrode and said side walls serving as a mask.

* * * * *

UNITED STATES PATENT AND TRADEMARK OFFICE
CERTIFICATE OF CORRECTION

PATENT NO. : 5,089,435
DATED : February 18, 1992
INVENTOR(S) : Hiroaki Akiyama

It is certified that error appears in the above-identified patent and that said Letters Patent is hereby corrected as shown below:

Column 1, line 56, change "ask" to --Mask--.

Signed and Sealed this

Twenty-fifth Day of May, 1993

Attest:

MICHAEL K. KIRK

Attesting Officer

Acting Commissioner of Patents and Trademarks